United States Patent
Kang

(10) Patent No.: US 10,176,885 B2
(45) Date of Patent: Jan. 8, 2019

(54) SEMICONDUCTOR MEMORY APPARATUS AND TEST METHOD THEREOF

(71) Applicant: SK hynix Inc., Icheon-si, Gyeonggi-do (KR)

(72) Inventor: Jae Seok Kang, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/843,465

(22) Filed: Dec. 15, 2017

(65) Prior Publication Data

US 2018/0286493 A1 Oct. 4, 2018

(30) Foreign Application Priority Data

Mar. 29, 2017 (KR) .................. 10-2017-0040076

(51) Int. Cl.
*G11C 7/00* (2006.01)
*G11C 29/38* (2006.01)
*G11C 29/36* (2006.01)
*G11C 7/22* (2006.01)

(52) U.S. Cl.
CPC ............... *G11C 29/38* (2013.01); *G11C 7/22* (2013.01); *G11C 29/36* (2013.01)

(58) Field of Classification Search
CPC . G11C 29/36; G11C 29/38; G11C 2029/0405; G11C 29/44; G11C 19/28; G11C 7/22; G11C 7/222; G11C 2207/2272
USPC ...... 365/201, 233.1, 233.11, 189.07, 185.09, 365/184
See application file for complete search history.

(56) References Cited

U.S. PATENT DOCUMENTS 7,821,313 B2 * 10/2010 Yamane ................ H03L 7/0814
327/149
7,876,641 B2 * 1/2011 Sasaki ...................... G11C 7/22
365/184
8,773,552 B2 * 7/2014 Egawa ................... H04N 5/378
250/208.1

FOREIGN PATENT DOCUMENTS

KR 1020020043378 A 6/2002
KR 100724342 B1 5/2007

* cited by examiner

*Primary Examiner* — Gene Auduong
(74) *Attorney, Agent, or Firm* — William Park & Associates Ltd.

(57) ABSTRACT

A semiconductor memory apparatus includes a comparison circuit generating a detection code in response to stored data and expected data, a counting circuit generating a counting code in response to the detection code, a selection code output circuit outputting one of a plurality of expected codes as a selection code in response to a selection signal, and a plurality of signal storage circuits. A comparison result output circuit including a plurality of signal storage circuits which stores a comparison result of a comparison between the counting code and the selection code in one signal storage circuit among the plurality of signal storage circuits according to the selection signal, and a value stored in one signal storage circuit among the plurality of signal storage circuits is output as a result signal in response to an output enable signal.

20 Claims, 3 Drawing Sheets

SEMICONDUCTOR MEMORY APPARATUS AND TEST METHOD THEREOF

CROSS-REFERENCES TO RELATED APPLICATION

The present application claims priority under 35 U.S.C. § 119(a) to Korean application number 10-2017-0040076, filed on Mar. 29, 2017, in the Korean Intellectual Property Office, which is incorporated herein by reference in its entirety.

BACKGROUND

1. Technical Field

Various embodiments generally relate to a semiconductor integrated circuit, and more particularly, to a semiconductor memory apparatus and a test method thereof.

2. Related Art

Semiconductor memory apparatuses may be configured to store data and output the stored data.

A task for determining the number of memory cells in which data is normally stored and the number of memory cells in which data is abnormally stored or is not stored may be performed by a test on whether semiconductor memory apparatuses normally store the data.

A task for determining whether to use the semiconductor memory apparatus based on the number of normal memory cells and the number of abnormal memory cells may be performed.

SUMMARY

In an embodiment of the present disclosure, a semiconductor memory apparatus may include: a comparison circuit configured to generate a detection code in response to stored data and expected data; a counting circuit configured to generate a counting code in response to the detection code; a selection code output circuit configured to output one of a plurality of expected codes as a selection code in response to a selection signal; and a comparison result output circuit including a plurality of signal storage circuits configured to store a comparison result of a comparison between the counting code and the selection code in one signal storage circuit among the plurality of signal storage circuits according to the selection signal, and the comparison result output circuit is configured to output a value stored in one signal storage circuit among the plurality of signal storage circuits as a result signal in response to an output enable signal.

In an embodiment of the present disclosure, a test method may include: storing data in a memory cell; comparing the stored data and expected data; comparing and storing a comparison result in the process of comparing the stored data and the expected data and a plurality of expected codes; and selectively outputting one of the values stored in the comparing and storing step.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present disclosure will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments of the present disclosure. However, embodiments of the present disclosure should not be construed as limiting the inventive concept. Although a few embodiments of the present disclosure will be shown and described, it will be appreciated by those of ordinary skill in the art that changes may be made in these embodiments without departing from the principles and spirit of the present disclosure.

Figure 1:
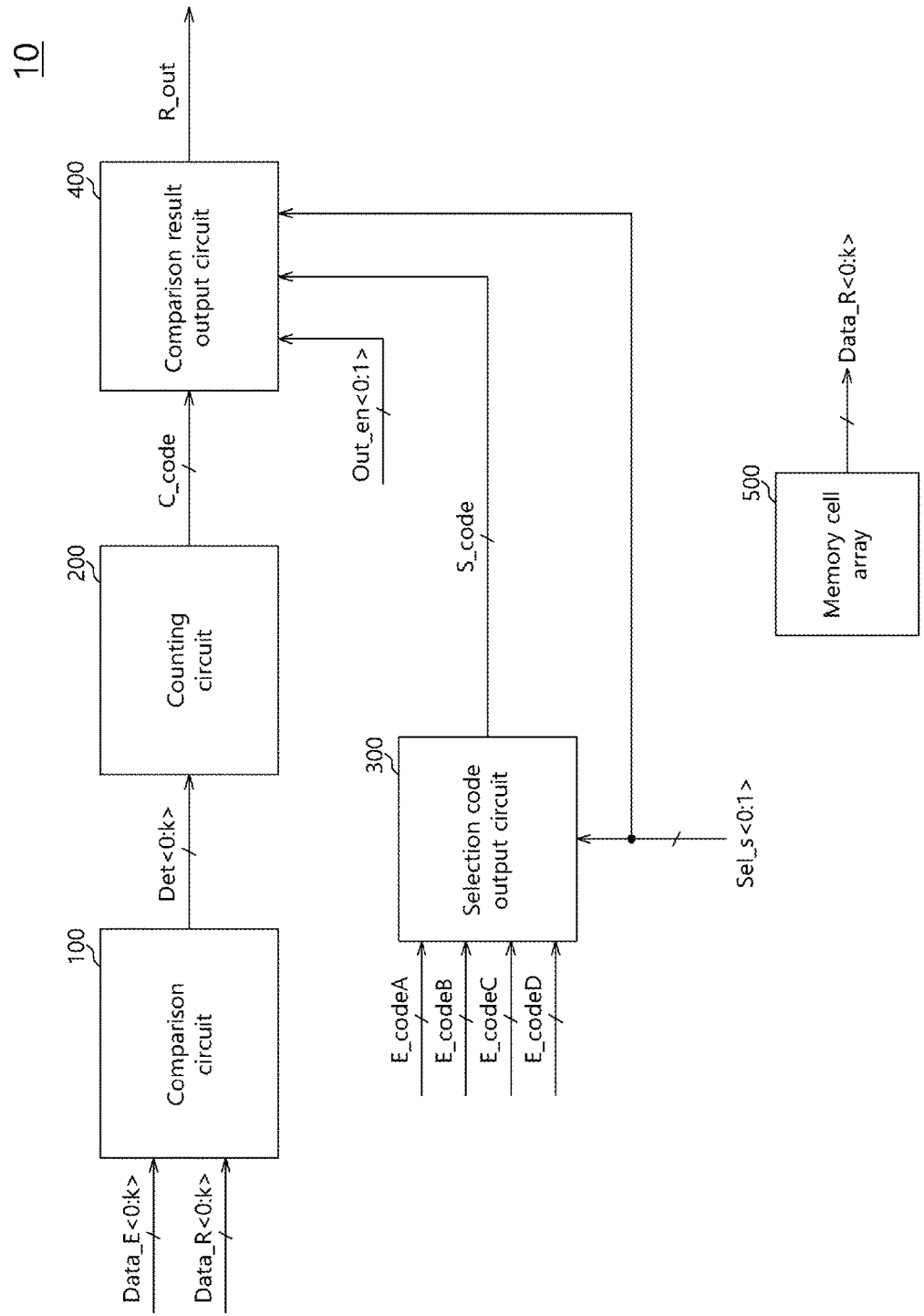
FIG. 1 is a diagram illustrating a configuration of a semiconductor memory apparatus according to an embodiment of the present disclosure.

As illustrated in FIG. 1, a semiconductor memory apparatus 10 according to an embodiment may include a comparison circuit 100, a counting circuit 200, a selection code output circuit 300, a comparison result output circuit 400, and a memory cell array 500.

The comparison circuit 100 may generate a detection code Det<0:k> in response to stored data Data_R<0:k> and expected data Data_E<0:k>. For example, the comparison circuit 100 may generate the detection code Det<0:k> by comparing the stored data Data_R<0:k> and the expected data Data_E<0:k>. In one example, the stored data Data_R<0:k> may be data stored in the memory cell array 500 and may include a plurality of data bits. The expected data Data_E<0:k> may be data that is expected to be stored in the memory cell array 500 and may include a plurality of data bits. For example, the comparison circuit 100 may generate the detection code Det<0:k> by comparing each data bit constituting the stored data Data_R<0:k> with each data bit constituting the expected data Data_E<0:k>. In this example, the comparison circuit 100 may generate a first bit code Det<0> of the detection code Det<0:k> by comparing a first data bit Data_E<0> of the expected data Data_E<0:k> with a first data bit Data_R<0> of the stored data Data_R<0:k>. When the first data bit Data_E<0> of the expected data Data_E<0:k> is equal to the first data bit Data_R<0> of the stored data Data_R<0:k>, the comparison circuit 100 may generate the first bit code Det<0> having a first level (for example, a low level) of the detection code Det<0:k>. When the first data bit Data_E<0> of the expected data Data_E<0:k> is different from the first data bit Data_R<0> of the stored data Data_R<0:k>, the comparison circuit 100 may generate the first bit code Det<0> having a second level (for example, a high level) of the detection code Det<0:k>. Accordingly, the comparison circuit 100 may generate all bits of the detection code Det<0:k> by comparing all data bits of the stored data Data_R<0:k> with all data bits of the expected data Data_E<0:k> bit by bit through the above-described comparison operation.

The counting circuit 200 may generate a counting code C_code in response to the detection code Det<0:k>. For example, the counting circuit 200 may generate the counting code C_code by counting the detection code Det<0:k>. In this example, the counting circuit 200 may generate the counting code C_code having a code value corresponding to the number of bits having the second level among the bits of the detection code Det<0:k>.

The selection code output circuit 300 may generate a selection code S_code in response to first to fourth expected codes E_codeA, E_codeB, E_codeC, and E_codeD and first and second selection signals Sel_s<0:1>. For example, the selection code output circuit 300 may output one of the first to fourth expected codes E_codeA, E_codeB, E_codeC, and E_codeD as the selection code S_code in response to the first and second selection signals Sel_s<0:1>. In this example, when both the first and second selection signals Sel_s<0:1> respectively have low levels (0,0), the selection code output circuit 300 may output the first expected code E_codeA as the selection code S_code. When the first and second selection signals Sel_s<0:1> respectively have a low level and a high level (0,1), the selection code output circuit 300 may output the second expected code E_codeB as the selection code S_code. When the first and second selection signals Sel_s<0:1> respectively have a high level and a low level (1,0), the selection code output circuit 300 may output the third expected code E_codeC as the selection code S_code. When both the first and second selection signals Sel_s<0:1> respectively have high levels (1,1), the selection code output circuit 300 may output the fourth expected code E_codeD as the selection code S_code. In an embodiment, the selection code output circuit 300 may include a multiplexer.

The comparison result output circuit 400 may generate a result signal R_out in response to the counting code C_code, the selection code S_code, the first and second selection signals Sel_s<0:1>, and first and second output enable signals Out_en<0:1>. For example, the comparison result output circuit 400 may compare the selection code S_code and the counting code C_code, and store a comparison result in a signal storage circuit designated through the first and second selection signals Sel_s<0:1>. Further, the comparison result output circuit 400 may output a signal stored in a signal storage circuit designated through the first and second output enable signals Out_en<0:1> as the result signal R_out. In this example, the comparison result output circuit 400 may include a plurality of signal storage circuits. The comparison result output circuit 400 may compare the selection code S_code and the counting code C_code and store a comparison result in one signal storage circuit among the plurality of signal storage circuits in response to the first and second selection signals Sel_s<0:1>. The comparison result output circuit 400 may output a value stored in one signal storage circuit among the plurality of signal storage circuits as the result signal R_out in response to the first and second output enable signals Out_en<0:1>.

Figure 2:
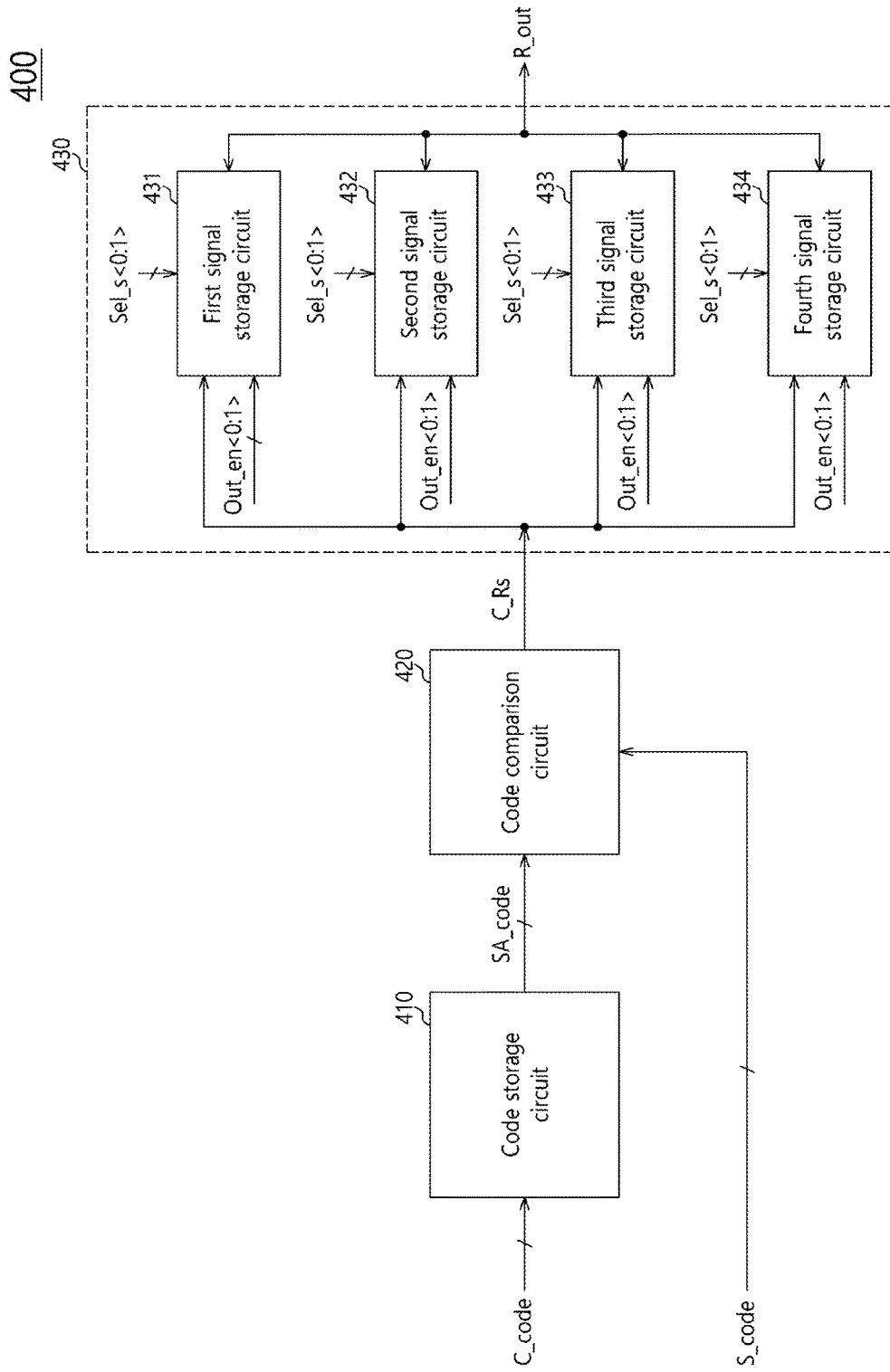
FIG. 2 is a diagram illustrating a configuration of a comparison result output circuit of FIG. 1.

As illustrated in FIG. 2, the comparison result output circuit 400 may include a code storage circuit 410, a code comparison circuit 420, and a signal storage circuit group 430.

The code storage circuit 410 may store the counting code C_code having a code value and output the counting code C_code as a stored code SA_code.

The code comparison circuit 420 may generate a code comparison result signal C_Rs by comparing the stored code SA_code and the selection code S_code. For example, the code comparison circuit 420 may generate the code comparison result signal C_Rs by comparing magnitudes of the code values of the stored code SA_code and the selection code S_code. In this example, when the code value of the stored code SA_code is greater than the code value of the selection code S_code, the code comparison circuit 420 may enable the code comparison result signal C_Rs. When the code value of the stored code SA_code is less than the code value of the selection code S_code, the code comparison circuit 420 may disable the code comparison result signal C_Rs.

The signal storage circuit group 430 may include a plurality of signal storage circuits 431, 432, 433, and 434. For example, the signal storage circuit group 430 may include first to fourth signal storage circuits 431, 432, 433, and 434. The signal storage circuit group 430 may store the code comparison result signal C_Rs in one signal storage circuit among the first to fourth signal storage circuits 431 to 434 in response to the first and second selection signals Sel_s<0:1>. The signal storage circuit group 430 may output the code comparison result signal C_Rs stored in one signal storage circuit among the first to fourth signal storage circuits 431 to 434 as the result signal R_out in response to the first and second output enable signals Out_en<0:1>.

An operation of semiconductor memory apparatus 10 having the above-described configuration according to an embodiment will be described below.

Data may be stored in the memory cell array 500. The data stored in the memory cell array 500 may be output as the stored data Data_R<0:k>.

The comparison circuit 100 may generate the detection code Det<0:k> by comparing the expected data Data_E<0:k> and the stored data Data_R<0:k>. For example, the comparison circuit 100 may generate the detection code Det<0:k> by comparing each bit constituting the expected data Data_E<0:k> and each bit constituting the stored data Data_R<0:k>. In this example, the comparison circuit 100 may generate the first bit code Det<0> of the detection code Det<0:k> by comparing the first data bit Data_E<0> of the expected data Data_E<0:k> and the first data bit Data_R<0> of the stored data Data_R<0:k>. When the first data bit Data E<0> of the expected data Data_E<0:k> is equal to the first data bit Data_R<0> of the stored data Data_R<0:k>, the comparison circuit 100 may generate the first bit code Det<0> of the detection code Det<0:k> having the first level (for example, a low level). When the first data bit Data_E<0> of the expected data Data_E<0:k> is different from the first data bit Data R<0> of the stored data Data_R<0:k>, the comparison circuit 100 may generate the first bit code Det<0> of the detection code Det<0:k> having the second level (for example, a high level). Accordingly, the comparison circuit 100 may generate all the bits of the detection code Det<0:k> by comparing all the bits of the expected data Data_E<0:k> and all the bits of the stored data Data_R<0:k>.

The counting circuit 200 may generate the counting code C_code by counting the number of bits having the second level (for example, a high level) among the bits of the detection code Det<0: k>.

The selection code output circuit 300 may output one expected code among the first to fourth expected codes E_codeA, E_codeB, E_codeC, and E_codeD as the selection code S_code in response to the first and second selection signals Sel_s<0:1>.

The comparison result output circuit 400 may include the plurality of signal storage circuits 431 to 434 and store a comparison result as the code comparison result signal C_Rs in one signal storage circuit among the plurality of signal storage circuits 431 to 434 in response to the selection code S_code. The comparison result output circuit 400 may store the comparison result as the code comparison result signal C_Rs by comparing the counting code C_code and the selection code S_code in response to the first and second selection signals Sel_s<0:1>. The comparison result output circuit 400 may output the code comparison result signal C_Rs stored in one signal storage circuit among the plurality of signal storage circuits 431 to 434 as the result signal R_out in response to the first and second output enable signals Out_en<0:1>.

An operation of the comparison result output circuit 400 will be described below in detail with reference to FIG. 2.

The comparison result output circuit 400 may include the code storage circuit 410, the code comparison circuit 420, and the signal storage circuit group 430 including the first to fourth signal storage circuits 431 to 434.

The code storage circuit 410 may store the counting code C_code and output the stored code value as the stored code SA_code.

The code comparison circuit 420 may generate the code comparison result signal C_Rs by comparing the stored code SA_code and the selection code S_code. For example, the code comparison circuit 420 may generate the code comparison result signal C_Rs by comparing the magnitudes of the code values of the stored code SA_code and the selection code S_code. In this example, when the code value of the stored code SA_code is greater than the code value of the selection code S_code, the code comparison circuit 420 may enable the code comparison result signal C_Rs. When the code value of the stored code SA_code is less than the code value of the selection code S_code, the code comparison circuit 420 may disable the code comparison result signal C_Rs. In other words, the code comparison result signal C_Rs may be enabled when the counting code C_code is greater than the code value of the expected code E_codeA, E_codeB, E_codeC, or E_codeD. Further, the code comparison result signal C_Rs may be disabled when the counting code C_code is less than the code value of the expected code E_codeA, E_codeB, E_codeC, or E_codeD.

One of the first to fourth signal storage circuits 431 to 434 may store the code comparison result signal C_Rs in response to the first and second selection signals Sel_s<0:1>. For example, the first signal storage circuit 431 may store the code comparison result signal C_Rs in response to the first and second selection signals Sel_s<0:1> respectively having low levels (0,0). The second signal storage circuit 432 may store the code comparison result signal C_Rs in response to the first and second selection signals Sel_s<0:1> respectively having a low level and a high level (0,1). The third signal storage circuit 433 may store the code comparison result signal C_Rs in response to the first and second selection signals Sel_s<0:1> respectively having a high level and a low level (1,0). The fourth signal storage circuit 434 may store the code comparison result signal C_Rs in response to the first and second selection signals Sel_s<0:1> respectively having high levels (1,1). In another example, one of the first to fourth signal storage circuits 431 to 434 may output the stored code comparison result signal C_Rs as the result signal R_out in response to the first and second output enable signals Out_en<0:1>. In this example, the first signal storage circuit 431 may output the stored code comparison result signal C_Rs as the result signal R_out in response to the first and second output enable signals Out_en<0:1> respectively having low levels (0,0). The second signal storage circuit 432 may output the stored code comparison result signal C_Rs as the result signal R_out in response to the first and second output enable signals Out_en<0:1> respectively having a low level and a high level (0,1). The third signal storage circuit 433 may output the stored code comparison result signal C_Rs as the result signal R_out in response to the first and second output enable signals Out_en<0:1> respectively having a high level and a low level (1,0). The fourth signal storage circuit 434 may output the stored code comparison result signal C_Rs as the result signal R_out in response to the first and second output enable signals Out_en<0:1> respectively having high levels (1,1).

A test operation of a semiconductor memory apparatus 10 which operates as described above according to an embodiment will be summarized in order below.

Data may be stored in the memory cell array 500 and the stored data may be output as the stored data Data_R<0:k>.

The comparison circuit 100 may generate the detection code Det<0:K> by comparing the stored data Data_R<0:k> and the expected data Data_E<0:k>. For example, the expected data Data_E<0:k> may be the same as data stored in the memory cell array 500. The comparison circuit 100 may generate the detection code Det<0:K> having a code value corresponding to the number of stored data Data_R<0:k> bits having different levels than the expected data Data_E<0:k> bits by comparing bits of the stored data Data_R<0:k> and bits of the expected data Data_E<0:k>. In one example, the comparison circuit 100 may determine whether each bit of the stored data Data_R<0:k> is equal to each bit of the expected data Data_E<0:k> and output the comparison result for each bit as the level of each bit of the detection code Det<0:k>. The comparison circuit 100 may be configured in such a manner that the code value of the detection code Det<0:k> is increased as the number of bits having different levels from each other between the stored data Data_R<0:k> and the expected data Data_E<0:k> is increased. For example, the comparison circuit 100 may generate the detection code Det<0:k> of which bits having the second level (for example, a high level) is increased as the number of bits having the different levels from each other between the stored data Data_R<0:k> and the expected data Data_E<0:k> is increased. In this example, when the number of bits having different levels from each other between the stored data Data_R<0:k> and the expected data Data_E<0:k> is three, three bits among the bits of the detection code Det<0:k> may have the second level (for example, a high level). Further, when the number of bits between the stored data Data_R<0:k> and the expected data Data_E<0:k> have different levels is k, k bits of the detection code Det<0:k> may have the second level (for example, a high level).

The counting circuit 200 may generate the counting code C_code having a code value corresponding to the code value of the detection code Det<0:k>. For example, the counting circuit 200 may generate the counting code C_code by counting the number of bits having a high level among the bits of the detection code Det<0:k>.

The selection code output circuit 300 may output one of the first to fourth expected codes E_codeA, E_codeB, E_codeC, and E_codeD as the selection code S_code in response to the first and second selection signals Sel_s<0:1>. The comparison result output circuit 400 may select one signal storage circuit among the first to fourth signal storage circuits 431, 432, 433, and 434 in response to the first and second selection signals Sel_s<0:1>.

The comparison result output circuit 400 may compare the magnitudes of the code values of the selection code S_code and the counting code C_code and store a comparison result of the magnitudes of the code values in the signal storage circuit selected through the first and second selection signals Sel_s<0:1>.

For example, when the selection code output circuit 300 outputs the first expected code E_codeA as the selection code S_code in response to the first and second selection signals Sel_s<0:1>, the comparison result between the counting code C_code and the selection code S_code may be stored in the first signal storage circuit 431. When the selection code output circuit 300 outputs the second expected code E_codeB as the selection code S_code in response to the first and second selection signals Sel_s<0:1>, the comparison result between the counting code C_code and the selection code S_code may be stored in the second signal storage circuit 432. When the selection code output circuit 300 outputs the third expected code E_codeC as the selection code S_code in response to the first and second selection signals Sel_s<0:1>, the comparison result between the counting code C_code and the selection code S_code may be stored in the third signal storage circuit 433. When the selection code output circuit 300 outputs the fourth expected code E_codeD as the selection code S_code in response to the first and second selection signals Sel_s<0:1>, the comparison result between the counting code C_code and the selection code S_code may be stored in the fourth signal storage circuit 434. Accordingly, the selection code output circuit 300 may output the expected code E_codeA, E_codeB, E_codeC, or E_codeD as the selection code S_code based on the value of the first and second selection signals Sel_s<0:1>.

One of the first to fourth signal storage circuits 431 to 434 may be selected in response to the first and second output enable signals Out_en<0:1> and the selected signal storage circuit may output the stored comparison result as the result signal R_out.

The semiconductor memory apparatus 10 which operates as described above according to an embodiment may compare all the plurality of expected codes E_codeA, E_codeB, E_codeC, and E_codeD with the counting code C_code, store the comparison result in the plurality of signal storage circuits, and selectively output the comparison result stored in the plurality of signal storage circuits.

It may be assumed that decimal numbers corresponding to the plurality of expected codes E_codeA, E_codeB, E_codeC, and E_codeD, for example, the first to fourth expected codes E_codeA, E_codeB, E_codeC, and E_codeD are 100, 200, 300, and 400.

The counting results for bits having different levels from each other between the stored data Data_R<0:k> and the expected data Data_E<0:k> may be output as the counting code C_code, and the counting code C_code may be compared with the selection code S_code. For example, when the code value of the counting code C_code is greater than or less than the code value of the first expected code E_codeA, the enabled or disabled code comparison result signal C_Rs may be stored in the first signal storage circuit 431. When the code value of the counting code C_code is greater than or less than the code value of the second expected code E_codeB, the enabled or disabled code comparison result signal C_Rs may be stored in the second signal storage circuit 432. When the code value of the counting code C_code is greater than or less than the code value of the third expected code E_codeC, the enabled or disabled code comparison result signal C_Rs may be stored in the third signal storage circuit 433. When the code value of the counting code C_code is greater than or less than the code value of the fourth expected code E_codeD, the enabled or disabled code comparison result signal C_Rs may be stored in the fourth signal storage circuit 434.

In this example, when the number of failed memory cells in the memory cell array 500 is less than 100, all the signals stored in the first to fourth signal storage circuits 431 to 434 may be output as the disabled result signal R_out.

When the number of failed memory cells in the memory cell array 500 is greater than or equal to 100 and less than 200, only the signal stored in the first signal storage circuit 431 among the signals stored in the first to fourth signal storage circuits 431 to 434 may be output as the enabled result signal R_out.

When the number of failed memory cells in the memory cell array 500 is greater than or equal to 200 and less than 300, only the signal stored in the second signal storage circuit 432 among the signals stored in the first to fourth signal storage circuits 431 to 434 may be output as the enabled result signal R_out.

When the number of failed memory cells in the memory cell array 500 is greater than or equal to 300 and less than 400, only the signal stored in the third signal storage circuit 433 among the signals stored in the first to fourth signal storage circuits 431 to 434 may be output as the enabled result signal R_out.

When the number of failed memory cells in the memory cell array 500 is greater than or equal to 400, only the signal stored in the fourth signal storage circuit 434 among the signals stored in the first to fourth signal storage circuits 431 to 434 may be output as the enabled result signal R_out.

The semiconductor memory apparatus according to an embodiment may continuously compare the counting code corresponding to the number of failed memory cells and the plurality of expected codes in a test for determining the number of failed memory cells in the memory cell array. Accordingly, the semiconductor memory apparatus according to an embodiment may accurately determine the number of failed memory cells in the test for determining the number of failed memory cells and thus the test time may be reduced.

Figure 3:
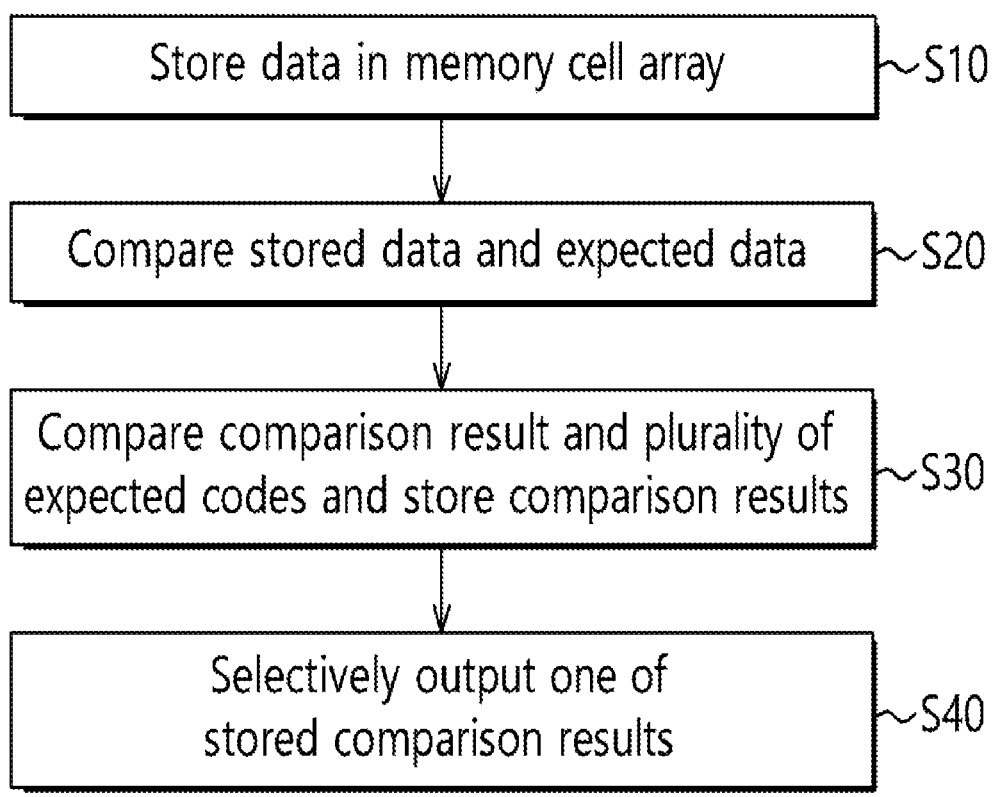
FIG. 3 is a diagram explaining a test operation of a semiconductor memory apparatus according to an embodiment of the present disclosure.

The test operation of the semiconductor memory apparatus 10 according to an embodiment will be summarized below with reference to FIG. 3.

Operation S10 of storing data in the memory cell array 500 is performed.

Operation S20 of comparing the stored data Data_R<0:k> stored in the memory cell array 500 and the expected data Data_E<0:k> may be performed.

Operation S30 of comparing the comparison result in operation S20 and the plurality of expected codes E_codeA, E_codeB, E_codeC, and E_codeD and storing the comparison results may be performed. For example, the counting code C_code may be compared with the plurality of expected codes E_codeA, E_codeB, E_codeC, and E_codeD and the comparison result output circuit 400 may store the comparison result. Further, the semiconductor memory apparatus 10 may compare and store the comparison result in the process of comparing the stored data Data_R<0:k> and the expected data Data_E<0> and a plurality of expected codes E_codeA, E_codeB, E_codeC, and E_codeD.

Operation S40 of selectively outputting one of the values stored in operations S30 of comparing and storing may be performed. For example, the counting circuit 200 may generate a counting code C_code having a code value corresponding to the code value of the detection code Det<0:k>.

The above described embodiments of the present disclosure are intended to illustrate and not to limit the present disclosure. Various alternatives and equivalents are possible. The disclosure is not limited by the embodiments described herein. Nor is the disclosure limited to any specific type of semiconductor device. Other additions, subtractions, or modifications are obvious in view of the present disclosure and are intended to fall within the scope of the appended claims.

What is claimed is:

1. A semiconductor memory apparatus comprising:
   a comparison circuit configured to generate a detection code in response to stored data and expected data;
   a counting circuit configured to generate a counting code in response to the detection code;
   a selection code output circuit configured to output one of a plurality of expected codes as a selection code in response to a selection signal; and
   a comparison result output circuit including a plurality of signal storage circuits configured to store a comparison result of a comparison between the counting code and the selection code in one signal storage circuit among the plurality of signal storage circuits according to the selection signal, and the comparison result output circuit is configured to output a value stored in one signal storage circuit among the plurality of signal storage circuits as a result signal in response to an output enable signal.

2. The semiconductor memory apparatus of claim 1, wherein the stored data is data stored in a memory cell array and the expected data is the same as data input to the memory cell array.

3. The semiconductor memory apparatus of claim 2, wherein the comparison result output circuit outputs the result signal based on a number of failed memory cells in the memory cell array.

4. The semiconductor memory apparatus of claim 1, wherein the comparison circuit generates the detection code having a code value corresponding to the number of bits having different levels by comparing bits of the stored data and bits of the expected data.

5. The semiconductor memory apparatus of claim 1, wherein the counting circuit generates the counting code having a code value corresponding to the detection code.

6. The semiconductor memory apparatus of claim 5, wherein the counting circuit generates the counting code by counting one of the high or low bits of the detection code.

7. The semiconductor memory apparatus of claim 1, wherein the comparison result output circuit includes:
   a code storage circuit configured to store the counting code and output the stored counting code as a stored code;
   a code comparison circuit configured to generate a code comparison result signal by comparing the stored code and the selection code; and
   a plurality of signal storage circuits configured to store the code comparison result signal in response to the selection signal and output the stored code comparison result signal as the result signal in response to the output enable signal.

8. The semiconductor memory apparatus of claim 7, wherein the code comparison circuit determines whether to enable or disable the code comparison result signal by determining whether a code value of the stored code is greater or less than a code value of the selection code.

9. The semiconductor memory apparatus of claim 8, wherein the code comparison circuit enables the code comparison result signal when the code value of the stored code is greater than the code value of the selection code and disables the code comparison result signal when the code value of the stored code is less than the code value of the selection code.

10. The semiconductor memory apparatus of claim 7, wherein the code comparison result signal is stored in one of the plurality of signal storage circuits in response to the selection code, and the code comparison result signal stored in one of the plurality of signal storage circuits is output as the result signal in response to the output enable signal.

11. The semiconductor memory apparatus of claim 1, wherein the comparison result output circuit stores the comparison result in the one signal storage circuit based on the selection code sent from the selection code output circuit and the counting code sent from the counting circuit.

12. The semiconductor apparatus of claim 11, wherein the selection code output circuit outputs the expected code as the selection code based on the value of the selection signal.

13. A test method comprising:
    storing data in a memory cell;
    comparing the stored data and expected data;
    comparing and storing a comparison result in the process of comparing the stored data and the expected data and a plurality of expected codes; and
    selectively outputting one of the values stored in the comparing and storing step.

14. The test method of claim 13, where the comparing of the stored data and the expected data includes:
    generating a detection code having a code value corresponding to the number of bits having different levels by comparing each bit of the stored data and each bit of the expected data; and
    generating a counting code having a code value corresponding to the code value of the detection code.

15. The test method of claim 14, wherein the comparing and storing includes comparing the counting code and the plurality of expected codes and stores the comparison results.

16. The test method of claim 15, wherein the comparing and storing includes:
    comparing each of the plurality of expected codes and the code value of the counting code, enabling a code comparison result signal when the counting code is greater than the code value of the expected code, and disabling the code comparison result signal when the counting code is less than the code value of the expected code; and
    storing comparison results obtained by comparing the plurality of expected codes and the code value of the counting code.

17. The method of claim 16, wherein the result signal is output based on a number of failed memory cells.

18. The method of claim 17, where the result signal is one of enabled or disabled.

19. The method of claim 17, where result signal is set based on whether the number of failed memory cells is less than 100, greater than 100 and less than 200, greater than 200 and less than 300, greater than 300 and less than 400, or is greater than or equal to 400.

20. The method of claim 13, where the value is output as a result signal based on an output enable signal.

* * * * *